United States Patent [19]

Russell

[11] Patent Number: 4,804,910

[45] Date of Patent: Feb. 14, 1989

[54] TRACTION LOAD METER SYSTEM

[75] Inventor: Jack A. Russell, Libertyville, Ill.

[73] Assignee: Vapor Corporation, Chicago, Ill.

[21] Appl. No.: 829,827

[22] Filed: Feb. 14, 1986

[51] Int. Cl.$^4$ .................. G01R 19/18; G08B 21/00; G06F 15/48

[52] U.S. Cl. .................. 324/120; 324/158 MG; 340/47; 340/52 F; 246/182 B; 246/182 R

[58] Field of Search .................. 324/120, 158 MG; 340/648, 664, 47, 52 F; 361/96, 97; 318/376, 380, 490; 246/1 C, 28 F, 182 B, 182 R, 167; 191/1, 2

[56] References Cited

U.S. PATENT DOCUMENTS

| | | | |
|---|---|---|---|
| 3,809,985 | 5/1974 | Krause et al. | 340/648 X |
| 4,173,732 | 11/1979 | Anderson | 318/380 X |
| 4,327,391 | 4/1982 | Grzebielski | 361/31 X |
| 4,413,325 | 11/1983 | Elfner et al. | 340/648 X |
| 4,417,229 | 11/1983 | Wilson | 340/47 X |
| 4,495,578 | 1/1985 | Sibley et al. | 246/182 R X |
| 4,498,077 | 2/1985 | Richardson | 340/664 X |
| 4,735,385 | 4/1988 | Nickles et al. | 246/182 B X |

Primary Examiner—Reinhard J. Eisenzopf
Assistant Examiner—Vinh P. Nguyen
Attorney, Agent, or Firm—Francis J. Lidd

[57] ABSTRACT

A traction load meter system for displaying information concerning the amount of current energizing electric motors which drive a locomotive. These motors have power and braking modes and have a continuous current rating. The system includes a current-to-frequency converter for providing an output signal having a frequency corresponding to the amount of current drawn by the motors. Electronic logic circuitry is included for receiving this output signal and being responsive thereto to provide outputs indicating whether the locomotive is in the power or braking mode, the amount of current being drawn, whether this amount is above the continuous rated current for the motors, and the period of time the above-rated condition has existed. Additionally, the meter system includes a display panel connected to the logic circuitry and adapted to be mounted in a cab of the locomotive for displaying to the engineer the aforementioned outputs of the logic circuitry.

11 Claims, 15 Drawing Sheets

TRACTION LOAD METER SYSTEM

BACKGROUND OF THE INVENTION

The present invention relates to display systems and, more particularly, to a traction load meter system for use with a diesel-electric locomotive.

Diesel-electric locomotives have a diesel generator for providing direct current to a number of traction motors which function to accelerate the locomotive. The traction motors are also used for braking the locomotive. Dynamic braking is obtained by disconnecting the motors from the power line and shunting their armatures with resistor banks. These traction motors are designed to operate continuously up to a rated power current and a rated braking current. Such motors are also designed to operate at currents above these rated currents but only for a limited period of time which is dependent upon the amount that the rated current is exceeded. Continued operation of the traction motors over the rated current for longer periods of time results in an overload condition, and operation of the motors in the overload condition could result in shortening of the service life of the motors or otherwise damaging them or the resistor banks.

Heretofore, the cab of the locomotive was equipped with an analog ammeter which indicated whether the motors were in their braking mode or their power mode. The meter also had a portion for indicating that above-rated currents were being drawn by the motors and marking adjacent this above-rated portion indicating the number of minutes the motors could be operated at such above-rated currents. The locomotive engineer was thus required to note the indicated acceptable time for a given above-rated current, and to keep track of the time elapsed in order to know when an overload condition existed. The required operation upon reaching the overload condition was to reduce the current to below the maximum continuous rated current and to operate at this reduced current until the motors had sufficient time to cool down. It will be appreciated that, with the many other duties of the engineer, sometimes this record and timekeeping might be neglected.

SUMMARY OF THE INVENTION

Among the several objects of the present invention may be noted the provision of an improved traction load meter system. The system provides indication, both in an analog and in digital form, of the current drawn by the motors and which mode the motors are in. Indication is further provided when the drawn current exceeds the above-rated current, how long this current can be held prior to onset of an overload condition, how long the above-rated current has been drawn, and when the overload condition exists. The meter system also indicates when a cool down state is present. As the meter system incorporates digital electronics and liquid crystal displays, it is extremely reliable and accurate in use. Additionally, the meter system of the present invention has long service life and is relatively easy and economical to manufacture. Other objects and features of the present invention will be, in part, apparent and, in part, pointed out specifically hereinafter in the specification and the attendant claims and drawings.

Briefly, the traction load meter system of the present invention includes a current-to-frequency converter for providing an output signal having a frequency corresponding to the amount of current drawn by the traction motors. The system also includes an electronic logic means for receiving the output signal and the logic means is responsive to the frequency of the signal to provide outputs indicating whether the locomotive is in the power or braking mode, the amount of current drawn, and whether this current is above the continuous rated current for the motors. Additionally, the logic means provides an output indicating the period of time the above-rated condition has existed. Finally, the meter system includes display means which is connected to the logic means and is adapted to be mounted in the cab of the locomotive for displaying to the engineer the aforementioned outputs of the logic means.

BRIEF DESCRIPTION OF THE DRAWINGS

Corresponding reference characters indicate corresponding components throughout the several views of the drawings.

DESCRIPTION OF THE PREFERRED EMBODIMENT

Figure 4:
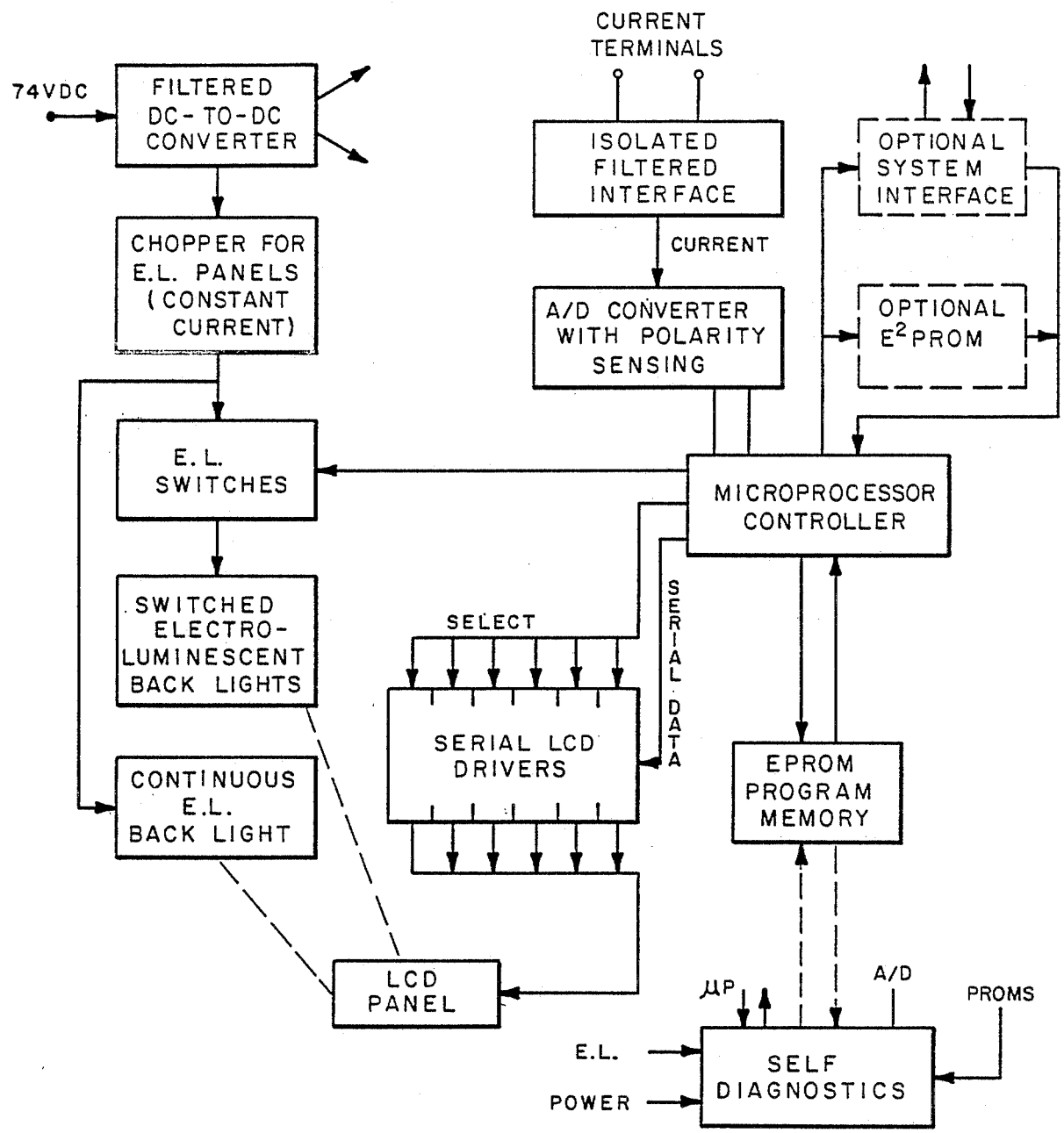
FIG. 4 is a block diagram of the various electronic components of the system of the present invention.

Referring now to the drawings, a traction load meter system of the present invention is indicated by reference numeral 20 in FIG. 4. System 20 is intended for use with a diesel-electric locomotive, having a number of direct current traction motors for powering and braking the locomotive. Such motors are designed to operate continuously up to a rated power current ($I_{LPR}$) and a rated braking current ($I_{LBR}$). These motors are also capable of operating at currents exceeding these ratings, but only for a limited period. Of course, the duration of this limited acceptable period is dependent upon the extent to which a rated current is exceeded. If the motors continue to be operated over the rated current for longer than the predetermined limited period, an overload condition exists. Such an overload condition can result in shortening of the service life of the motors or, in an extreme case, burnout of a motor winding or a resistor bank.

Figure 1:
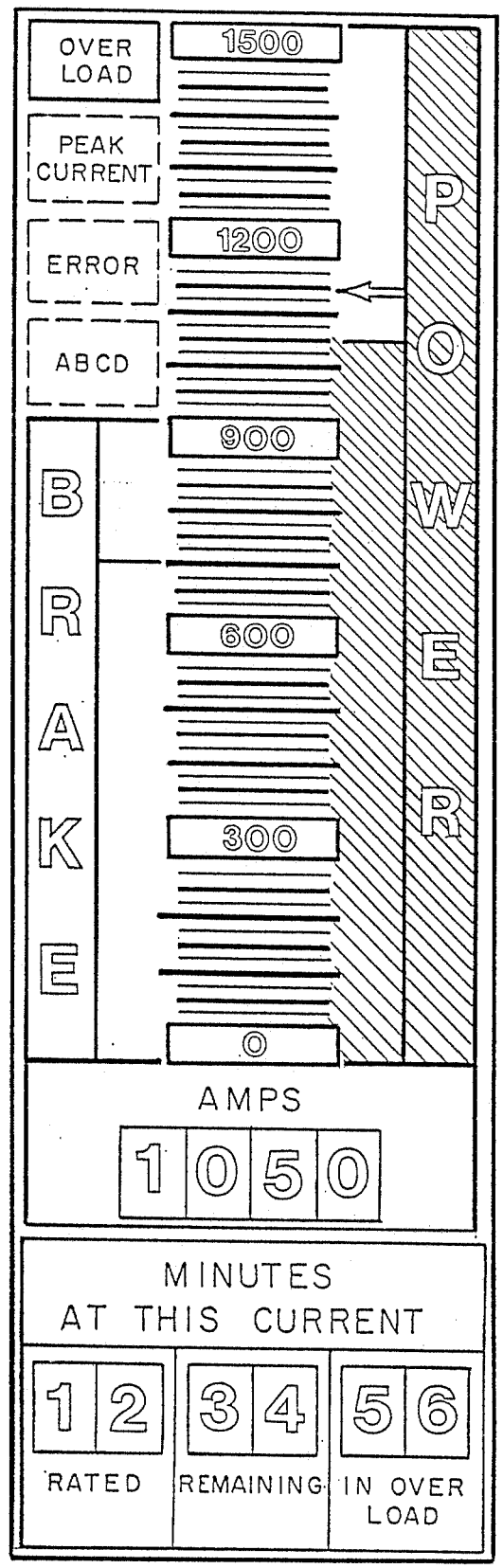
FIG. 1 shows the face of a display of the traction load meter system of the present invention indicating that current is being applied to power the locomotive.
Figure 2:
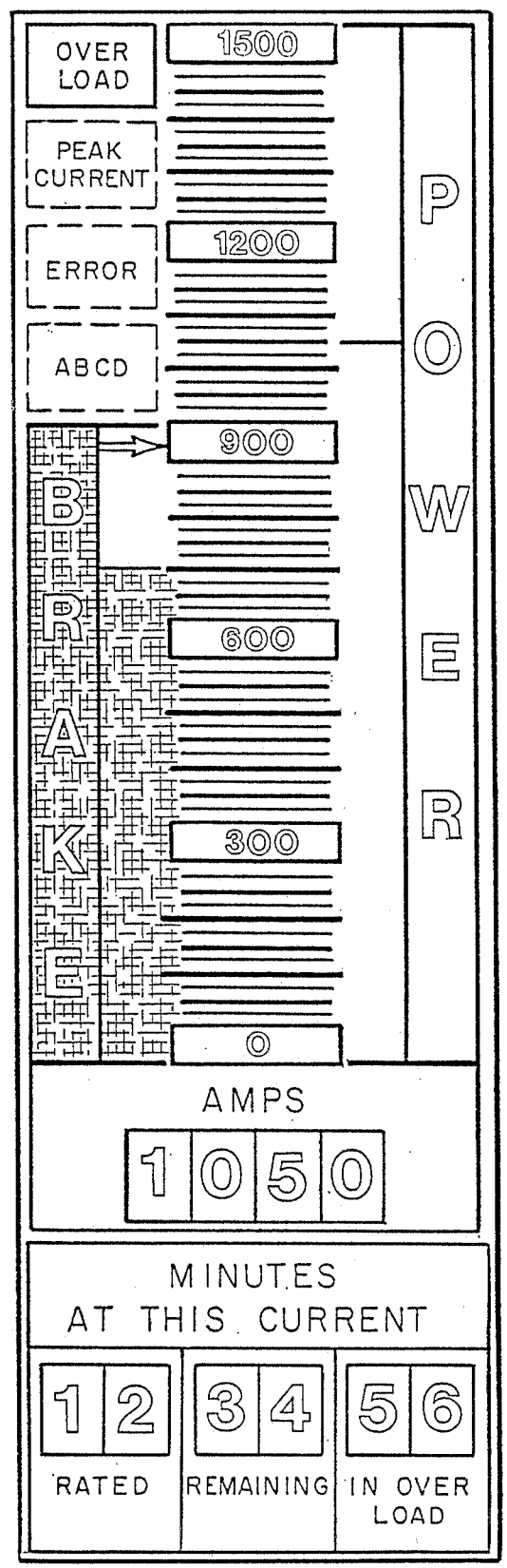
FIG. 2, similar to FIG. 1, depicts the display indicating that current is being applied to decelerate the locomotive.
Figure 3:
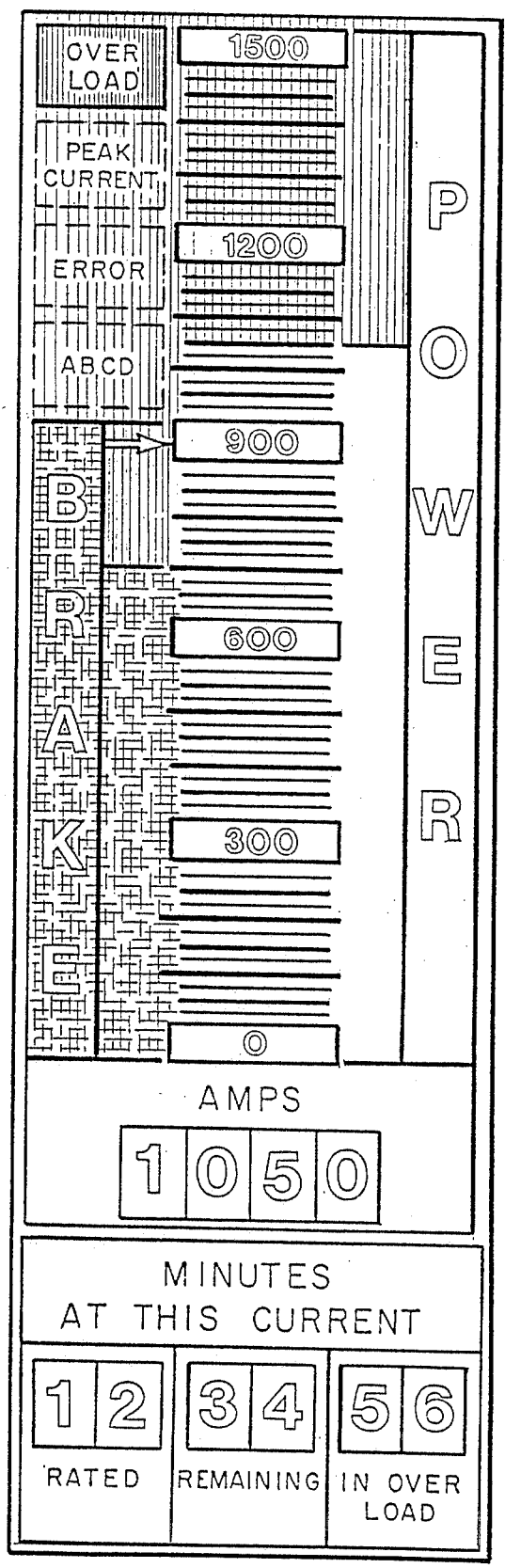
FIG. 3, also similar to FIG. 1, illustrates the display warning that there exists a current overload condition in the braking mode.

The system 20 includes a display 22, best shown in FIGS. 1–3, adapted to be mounted in the cab of the locomotive for observation by the engineer. The system also includes a current-to-frequency converter system 24, best shown in FIG. 5, for providing a pulse train logic output, the frequency of which indicates not only the amperage supplied to the traction motors, but also whether the current is negative or positive: thus identifying whether the motors are operating in their power mode or their braking mode. This logic output is received by electronic logic means 26, see FIG. 7, including a microprocessor M. The logic means 26 is responsive to the output of converter 24 to provide outputs to the display 22 indicating whether the locomotive is in the power mode or the braking mode, the amount of current drawn by the traction motors, whether this amount exceeds the rated current in the operating mode, how long the above-rated condition is allowed to exist before an overload condition is reached, how long the above-rated condition has existed, and if and how long an overload condition has existed.

As shown in FIGS. 1-3, the display 22 is divided into a lower digital portion 28, an intermediate analog portion 30 and an upper left annunciator section 32. The digital portion indicates the amperage being drawn, and has a lower timing section 34 divided into three components 36, 38, and 40. The left component provides an indicative of total minutes the motors can safely operate over the rated current at a particular, over-rated operating current. The middle component provides a reading of the remaining number of these total minutes (total minutes allowable at that particular current minus elapsed minutes). And the right component warns how long an overload condition has existed. The intermediate portion 30 includes a left section 42 for indicating the motors are in the braking mode and a right section 44 for indicating the motors are in the power mode with the two sections sharing a vertically arranged central scale 46. The annunciator section includes vertically arranged identification boxes and is adapted to flash when any of several alarm conditions (to be further discussed later) exist.

As shown in FIG. 1, when the power mode is being used, the power section is illuminated in green and it has a pointer arrow section 48 for indicating the amperage being drawn on the scale 46. FIG. 2 shows the results of the traction motors being used in the braking mode. The brake section 42 is illuminated in yellow, and there is a brake pointer arrow section 50 for indicating the current drawn on scale 46. FIG. 3 indicates braking operation in an overload condition. Not only is the brake section 42 illuminated in yellow, but the annunciator is illuminated in red and the appropriate indicator box 32a of the annunciator section 32 is brightly illuminated. Thus, the display provides unique illumination indication when the motors are in the power mode, the braking mode, and when an overload condition exists. Additionally, it offers a unique color indication when an above-rated current condition exists prior to overload: the annunciator section 32 is illuminated in red without box 32a being brightly lighted.

Figure 5:
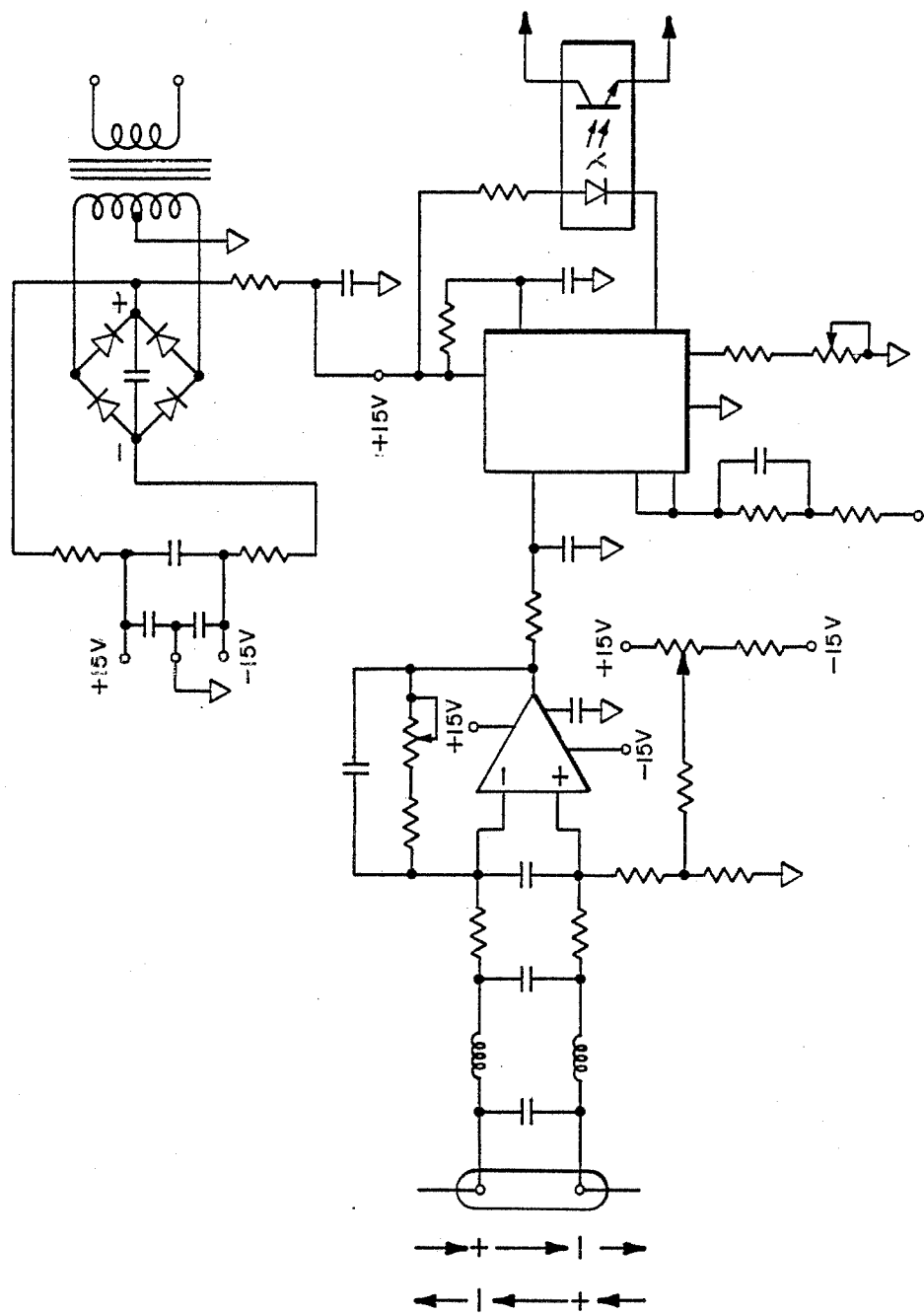
FIG. 5 is an electrical schematic diagram of a current-to-frequency converter for the load meter system.
Figure 7:
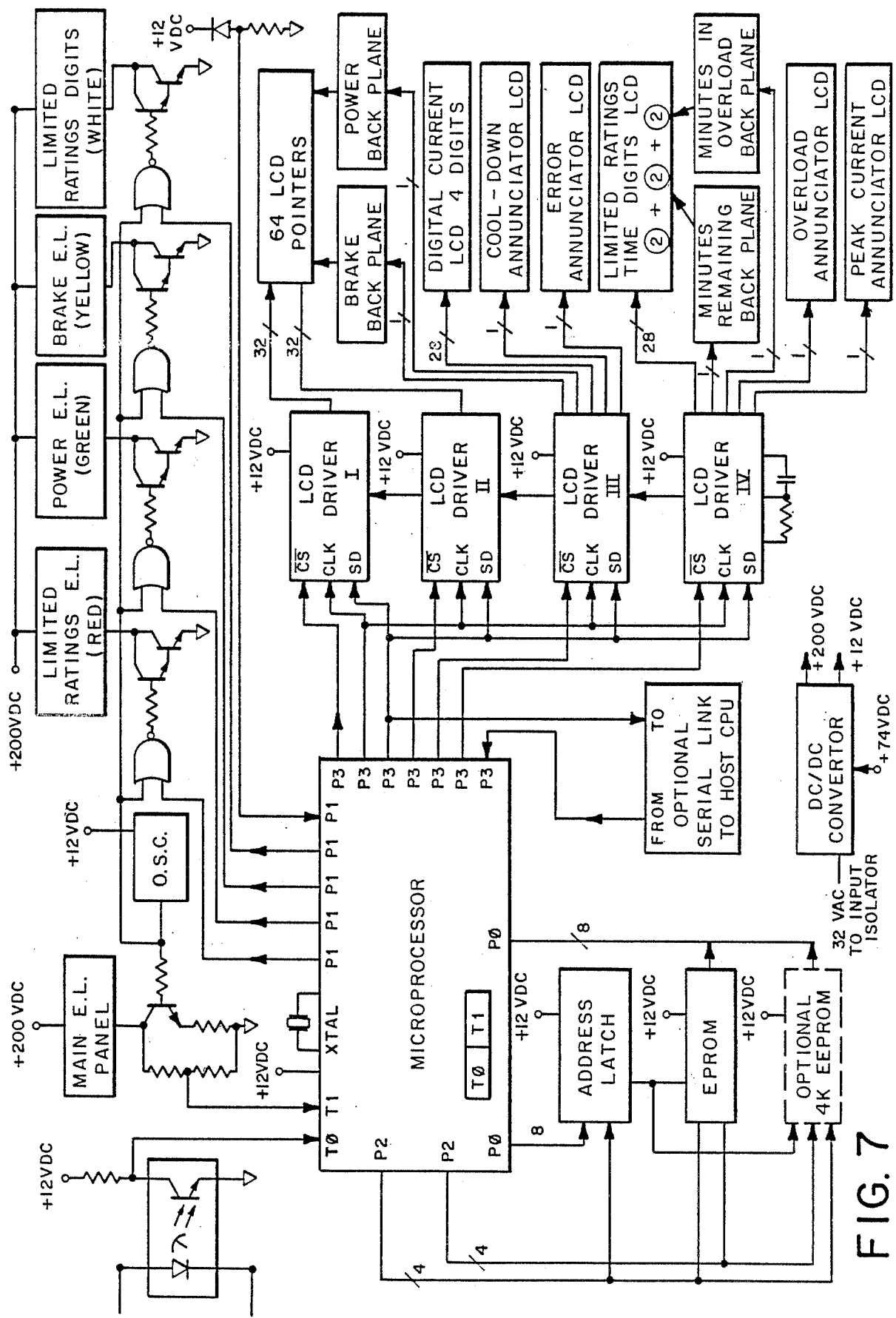
FIG. 7 is a diagram, partly schematic in nature, illustrating various digital logic components, including a microprocessor, employed in the system of the present invention.

The traction load meter system 20 includes a converter 52, shown in block form in FIG. 7, which converts a 74 volt DC output from the generator of the locomotive into several outputs, both DC and AC. Two hundred volts DC is provided for the electroluminescent back lighting units of the display, 12 volts DC is provided for the electronic logic means 26 and 32 volts AC is provided to the primary winding of an isolation transformer T. Referring to FIG. 5, the secondary winding of the transformer forms part of a power supply 54 for the current-to-frequency converter 24. The power supply includes a full wave bridge rectifier, formed by diodes D1-D4, connected across the secondary winding with the positive and negative outputs of the rectifier interconnected by a filter capacitor C1. The positive output is grounded through a current limiting resistor R1 and a capacitor C2. A single capacitor C3 filter is used across the rectifier, and the +15 volt and −15 volt outputs of the power supply are connected to their corresponding rectifier outputs through current limiting resistor R2, R3, respectively. Connected between the power supply outputs are serially connected decoupling capacitors C4, C5 for an operational amplifier 56.

A shunt 58 is used to monitor the current drawn by the locomotive traction motors (or resistor banks) and provides an output of 50 millivolts per 1000 amperes drawn. The output of the shunt is smoothed by an LC capacitor input filter, formed by the series-parallel combination of inductors L1, L2 and capacitors C6, C7; and then is supplied to the inverting and non-inverting inputs of the operational amplifier through input resistors R4, R5, respectively. The op amp functions (along with the shunt) has a current to voltage converter and it has a negative feedback loop for providing gain adjustment of the amplifier. This loop includes a resistor R6 placed in series with a variable resistor R7 and both paralleled by a capacitor C8. Connected to the non-inverting input of the op amp is a resistance network for providing zero adjustment so that at the maximum braking current drawn by the traction motors, the output of the op amp is a predetermined low positive voltage which increases as the braking current decreases. The output voltage continues to increase with increasing current drawn in the power mode of the traction motors, as shown in the upper plot of the graph of FIG. 6. The resistor network includes a potentiometer 59 series connected with a resistor R8 between the +15 V and −15 V outputs of power supply 54, a voltage divider including resistor R9 and resistor R10 connected between the non-inverting output of the op amp and ground, and a resistor R11 connected between the midpoint of the voltage divider and the tap of the potentiometer.

The output of the op amp 56 is supplied as the input to a voltage-to-frequency converter 60 through an input resistor R12 and protected from voltage spikes by means of a transient voltage suppression capacitor C9 which is grounded. The converter 60 provides an output pulse train at a frequency which is precisely proportional to the magnitude of the applied input voltage. Thus it functions as an analog-to-digital converter for the electronic logic means 26. An example of such a voltage-to-frequency converter is Model LM 231A made by National Semiconductor. Connected to the converter 60 is a timing network including a resistor R13 and a capacitor C10, a load network including a resistor R14 shunted by a capacitor C11 serially connected with a resistor R15 to ground, and a gain adjustment network including the series combination of a resistor R16 and a variable resistor R17. The output of the converter is connected to the cathode of a light emitting diode LED1, the anode of which is connected to the positive power supply voltage through a current limiting resistor R18. The LED1 is part of an optically coupled voltage isolator which also includes a phototransistor PT which is rendered conductive upon the LED being energized.

Figure 6:
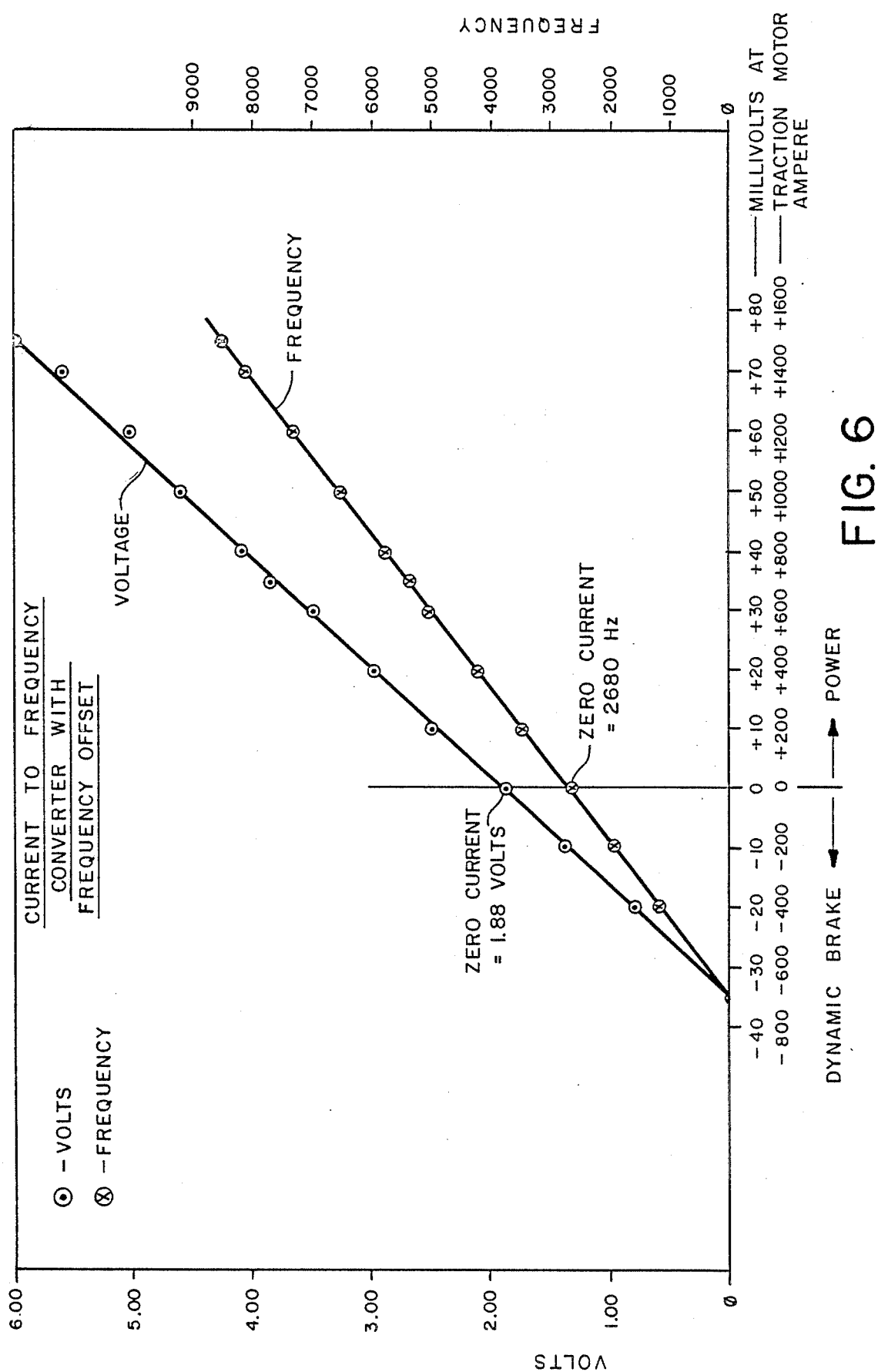
FIG. 6 is a graph depicting the linear correspondence between the frequency output of the converter and the current input to the motors of the locomotive.

The frequency of the pulse train output with respect to the current (both in the braking mode and the power mode) drawn by the traction motor is shown in the lower linear plot on the graph of FIG. 6. The current to frequency converter system 24 provides a positive wavetrain of varying frequency depending on the current drawn by the traction motors and whether they are in the braking mode or the power mode. At the maximum braking current, the frequency of the pulse train is at a predetermined minimum. As the braking current decreases the pulse train frequency increases until the braking current is zero. When the motors are in their power mode, the frequency continues to increase with the maximum pulse train frequency indicating a maximum traction motor load current in the power mode. Thus, the frequency of the pulse train determines current and the mode of operation of the traction motors.

The heart of the electronic logic means 26 is the microprocessor M which is responsive to the frequency of the pulse train from the phototransistor and a microprocessor program (a flow chart of which is shown in FIGS. 8a–8h), to control the operation of the display 22. "Look-up" tables used with the program are stored in an erasable programmable read only memory EPROM. The microprocessor has a number of connection ports or pins: ports T∅ and T1 are sensor ports for receiving the pulse train and for monitoring the operation of the electroluminescent display panel, respectively; the various P1 ports are used to energize the various colored backlighted electroluminescent portions of the display and to monitor the status of the +12 V DC power for the logic circuitry from voltage converter 52; the P3 ports are employed to control various liquid crystal displays on the display panel; the P2 ports are connected for control (program sequencing) and address purposes with an addressable latch and the EPROM; and the P∅ ports are used for addressing the EPROM through the latch and for receiving data from the EPROM. Additionally, the microprocessor has ports for connection to the +12 V DC power source, to ground, and to a crystal XTAL which establishes master timing for the electronic logic means. The microprocessor also has a pair of internal timers which are used for timing the period the traction motors are operated above rated current and in an overload condition, as shown in the program flow chart in FIGS. 8a–8h.

More specifically, the display 22 has certain electroluminescent portions which are energized when the display is turned on. These main panel portions 62 are connected from the +200 V DC output of the voltage converter 52 through a transistor T1 and a current limiting resistor R20 to ground. Conduction of the transistor is controlled by an oscillator OSC connected to the base of the transistor through an input resistor R21. Connected in parallel with T1 and R20 is a voltage divider formed of resistors R22 and R23, with the midpoint of the divider connected to a microprocessor sensor port T1. The maintenance of a ground level signal at port T1 for a time greater than the period of the oscillator output indicates that the main panel portions 62 of the display are not energized.

The output of the oscillator also acts to enable NOR logic gates which control energization of colored backlighted portions of the display panel; the yellow brake portion 42, the green power portion 44, the red annunciator portion 32 and the digital timing section 34 which is white. As each energization circuit is identical, only one will be described in detail. The circuit used to energize the power portion 44 green backlighting includes a NOR gate G1 the enable input of which is connected to the output of the oscillator. The other input of gate G1 is connected to a P1 microprocessor port. The output of the gate G1 turns on, through input resistor R24, Darlington compound connected transistors T2, T3 which in turn connect the green section 44 from +200 V DC to ground to cause illumination. The remaining microprocessor P1 port is connected as a power source monitor by virtue of its interconnection with a zener diode D5 and a resistor R25 series connected between the microprocessor +12 V DC power supply and ground.

The P3 ports of the microprocessor are interconnected with a plurality of LCD drivers DR1–DR4 which control energization of the various liquid crystal displays on the display panel: 64 LCD pointers (32 for each pointer arrow section 48 and 50); the four digit digital current readout 33 and the two digit time readouts 36, 38, 40. Additionally, the drivers DR1–DR4 control energization of back plane lighting for the arrow sections 48 and 50, back plane lighting for time readout sections 38 and 40 as well as for the annunciator indicator boxes 32A–32D. Each driver is connected to a driver enable microprocessor port and they are commonly connected to microprocessor ports providing a clock signal and data signals in serial form. The various drivers are maintained in phase by an oscillator formed by an RC circuit made up of a resistor R26 and a capacitor C11 connected to driver DR4, and the output of which is channeled to each remaining driver.

Referring to FIGS. 8a–8h, a flow chart is shown of a computer program for operating the microprocessor. It is noted that one of skill in the art can easily generate a source code and/or operating code for the microprocessor based upon this flow chart. The flow chart includes a main routine shown in FIG. 8a, a pointers/digits display subroutine listed in FIG. 8b, a limited power ratings timer routine set forth in FIG. 8c, a minutes in overload routine delineated in FIG. 8d, a limited power ratings display subroutine illustrated in FIG. 8e, a cool down routine depicted in FIG. 8f, a minutes remaining routine shown in FIG. 8g and a start timing routine listed in FIG. 8h.

Before turning to a detailed description of the various routines and subroutines, it is helpful to introduce various items which will appear. The microprocessor incorporates various registers where information is temporarily stored. These registers are as follows: frequency, current, analog current, serial word (multiple), minutes remaining, minutes in overload, rated minutes, cool down minutes remaining, peak current, and cool down overload. A number of flags are established for setting or resetting in accordance with a change in an assigned condition. Among these flags are: power mode, brake mode, cool down (multiple), overload, minutes remaining, peak current annunciator, and limited power ratings mode. The EPROM serves a look-up table function for a particular locomotive. More specifically, it functions as a pair of look-up tables: (1) it provides rated minutes that the traction motors can operate at a given above-rated current before an overload condition exists; and (2) it indicates the necessary cool down time when the current drops below rated current.

Figure 8A:
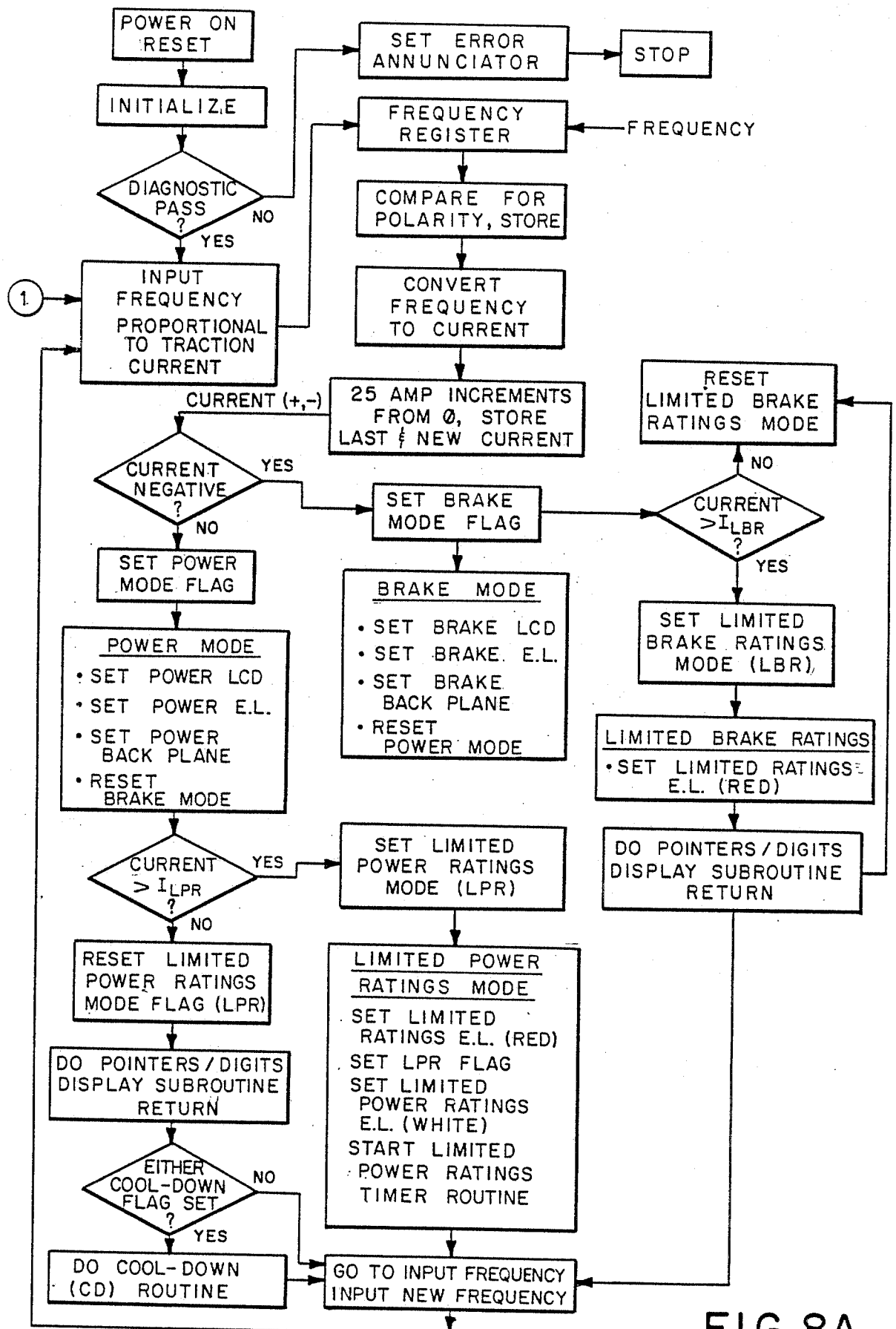
FIGS. 8a–8h show a flow diagram for a computer program for operating the microprocessor.

Referring to the main routine of FIG. 8a, energization of the electronic logic means causes initializing including resetting of the various flags. Decision block 104 causes the error annunciator indicator box 32C to be energized and the program to stop should the self-diagnostic system 64, shown in FIG. 4, determine an electrical or electronic malfunction. Such self-diagnostic systems are well known to those of skill in the art and they need not be further discussed here. Assuming the diagnostic test is passed, the frequency of the output of the current-to-frequency converter system 24 is stored in the frequency register (operation block 112) and then compared for polarity. Note from the lower plot of FIG. 6 that a frequency above 2700 Hertz indicates the traction motors are in their power mode while a frequency below that level means the motors are in their braking mode. After the frequency is converted to current (block 116), the current is divided by 25 because the power and brake pointer arrow systems 48 and 50 only register in 25 ampere intervals, and the current is stored in the current register. Assuming the traction motors are in their power mode (positive current), decision block 120 causes the power mode flag to be set (block 126) and the power mode liquid crystal display (pointer system 48), electroluminescence (backing for power section 44) and back plane (for pointer system 48) all to be set and similar components for the brake mode to be reset. Again assuming that the current being drawn by the traction motors in their power mode does not exceed rated power current ($I_{LPR}$), decision block 140 causes the limited power ratings mode flag to reset (if it had not already been reset) and the microprocessor to start the pointers/display subroutine.

Figure 8B:
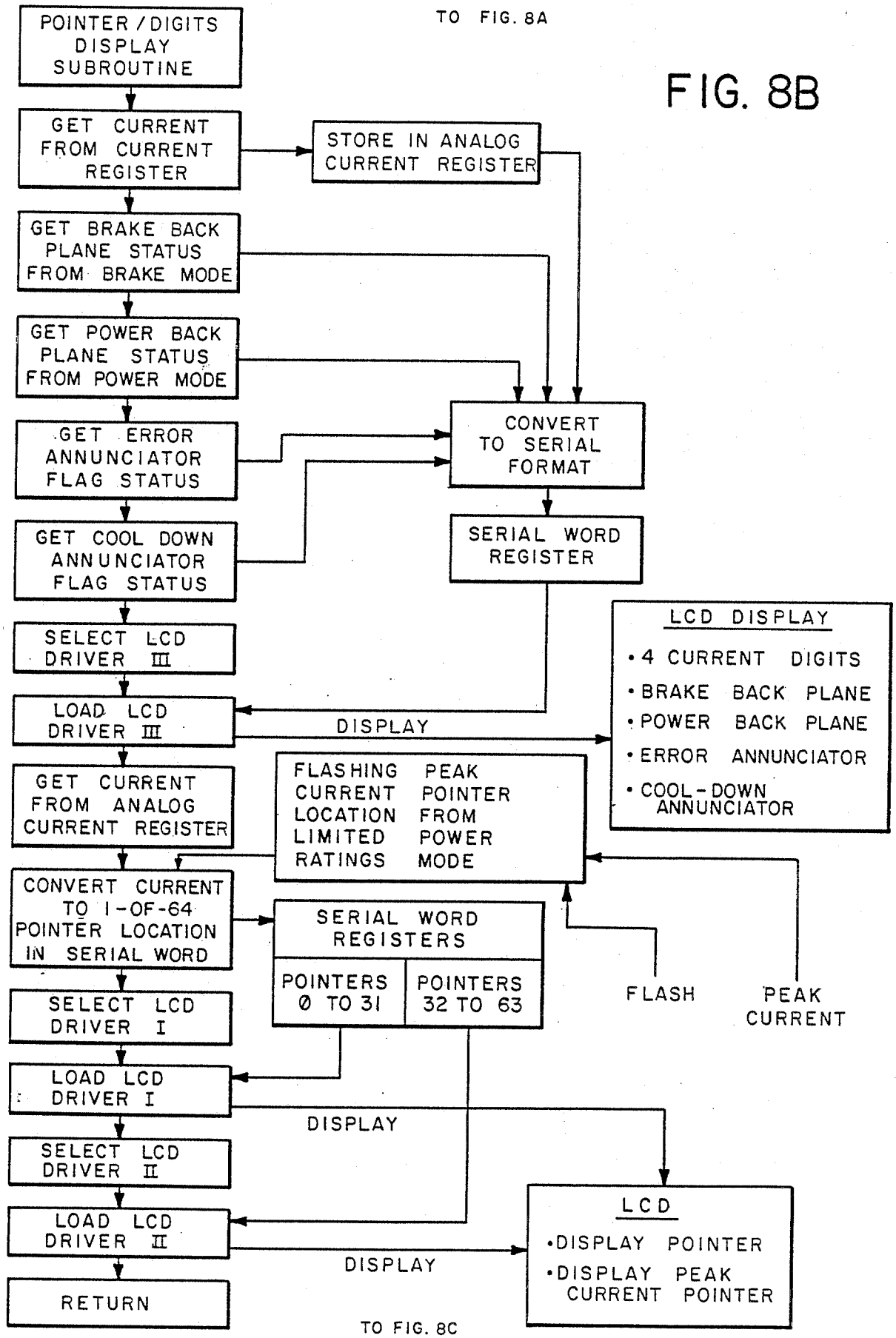

Referring to FIG. 8b, in the pointer/display subroutine the current is obtained from the current register (block 162), stored in the analog current register and converted to serial (as opposed to parallel) format. The status of various back planes and flags is also obtained, however, only the power back plane is set and is also converted to serial format and placed, along with the serialized current, in the serial word register (block 180). After LCD driver DR3 is selected and loaded, the LCD display is energized (block 182) to show the four digit current in digital current LCD 33 and to provide a back plane for the power pointer arrow system 48. After the current is obtained from the analog current register, it is converted to the proper one of the 64 pointers and that is placed in the serial word registers for the pointers (block 190). After the proper of LCD drivers DR1, DR2 is selected and loaded, the proper display pointer of power pointer arrow system 48 is energized. Suppose the below-rated power current was 1050 amperes. At this time, the digital current LCD 33 would show 1050, the power section 44 electroluminescent panel would be energized (green), the arrow of power arrow system 48 adjacent 1050 on the scale 46 would be on, and the back lighting for section 48 would be energized.

Returning to the main routine of FIG. 8a, suppose the current being drawn by the traction motors in their power mode now exceeds the rated power current. The decision block 140 sets the limited power ratings mode (block 152) by turning on, through the appropriate P1 outputs of the microprocessor, the red limited ratings electroluminescent panel of annunciator portion 32 and the white limited ratings digits panel of the timing section 34. Additionally, the limited power ratings flag is set and the limited power ratings timer routine is started.

Figure 8C:
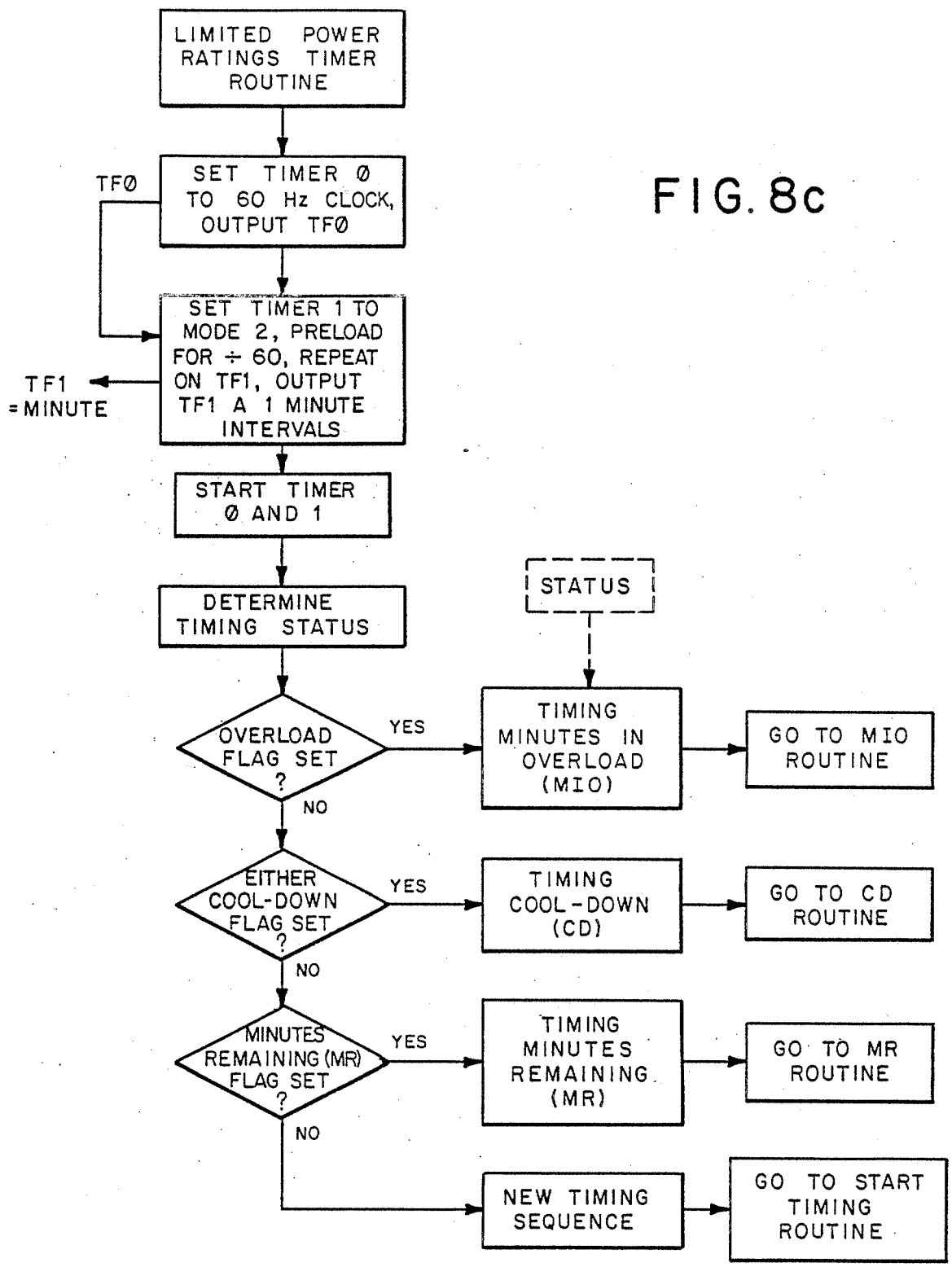

Turning to FIG. 8c, in the limited power ratings timer routine microprocessor timer T0 is set to a 60 Hertz clock and microprocessor timer T1 is set to count down from 60, providing its output at one minute intervals (block 214). Next, the timers are started and, since none of the flags mentioned in decision block 220, 226, 232 is set, the program proceeds to the timing routine of FIG. 8g. In the timing routine, current is obtained from the current register (block 456) and the rated minutes that the traction motors can operate at that above-rated current prior to the existence of an overload condition, is "looked-up" in the EPROM (block 458). After the rated minutes are stored in the rated minutes register and in the minutes remaining register, the minutes remaining flag is set and the program goes on to the limited power ratings display subroutine.

Figure 8D:
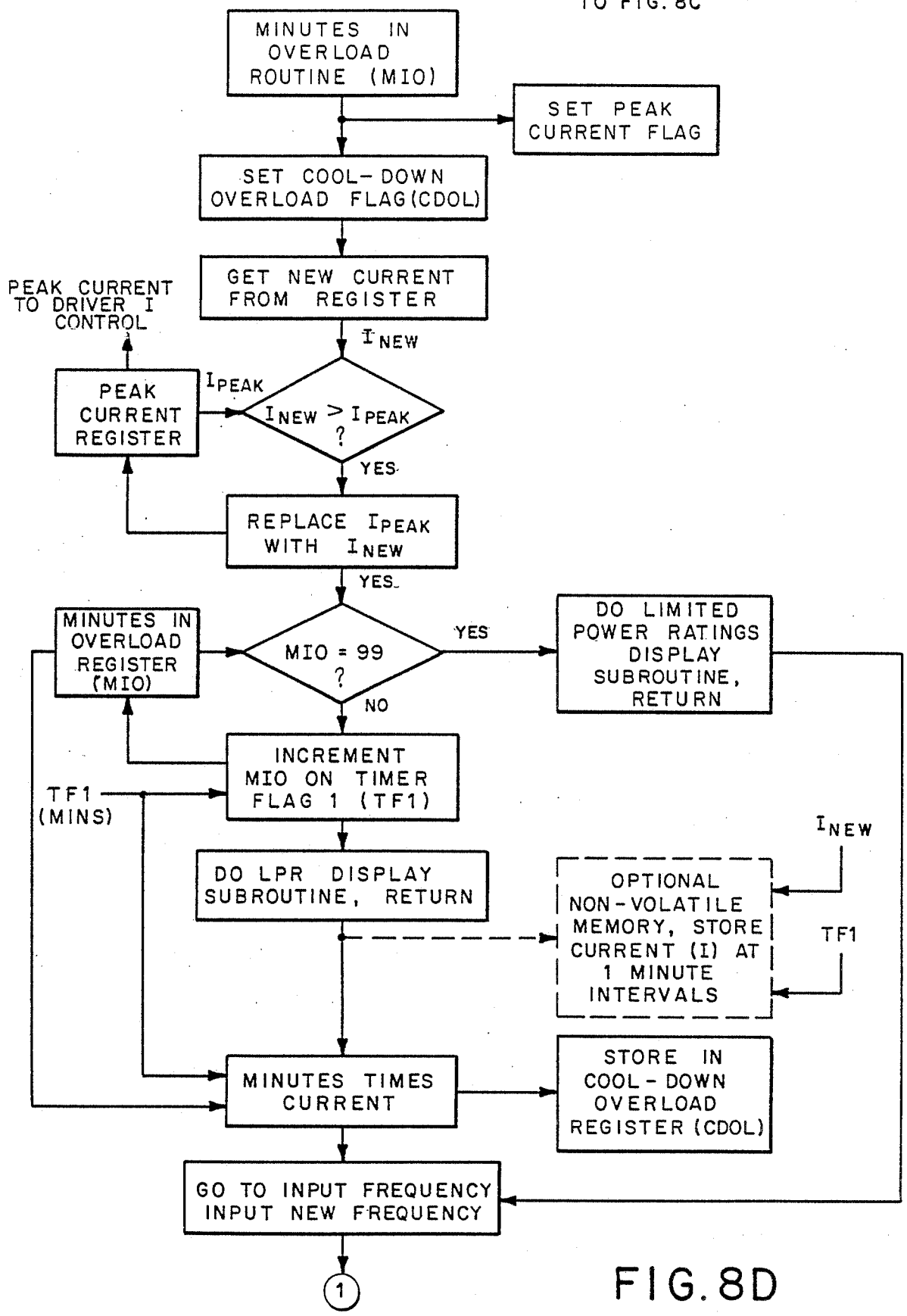
Figure 8E:
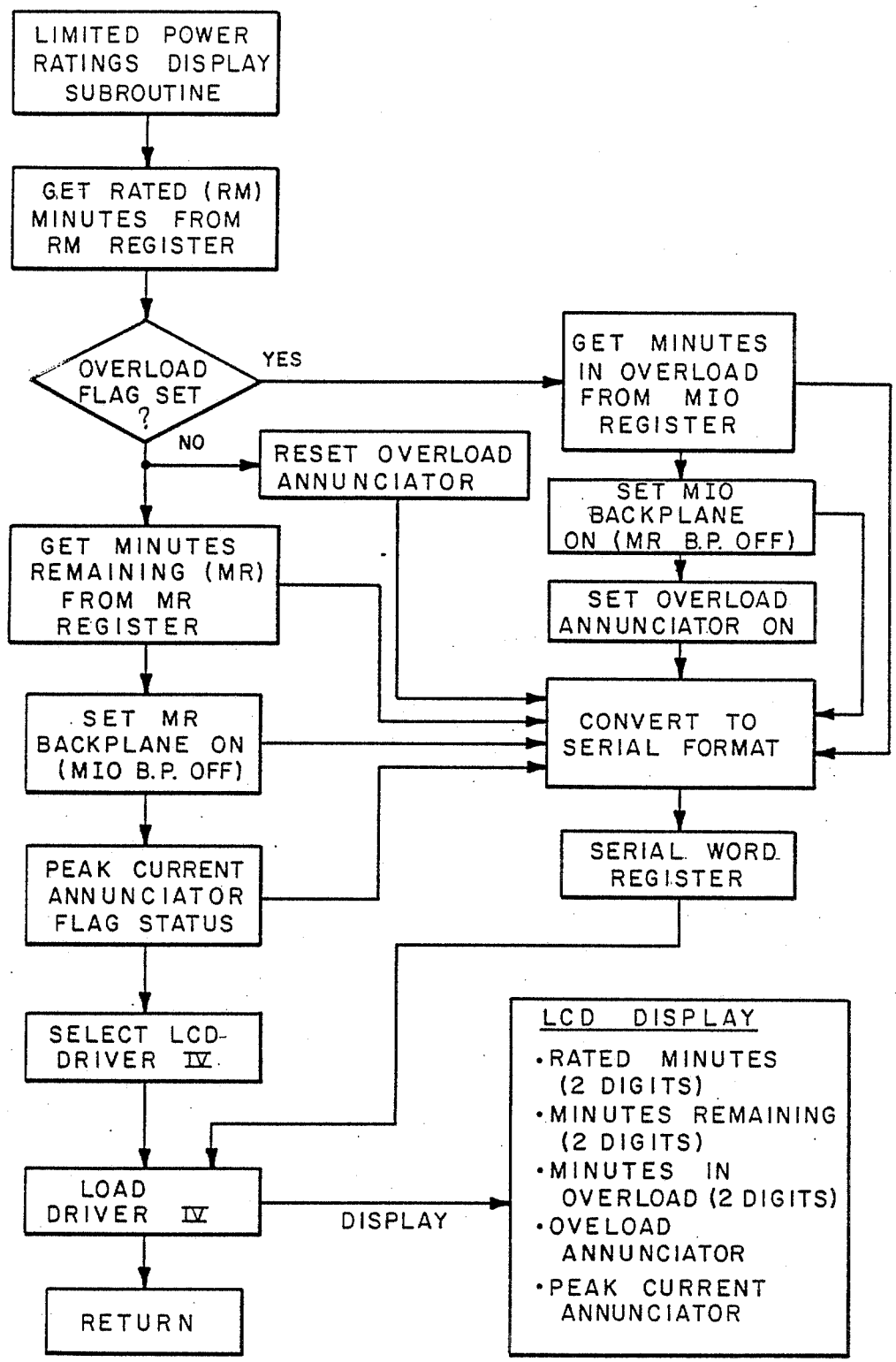
Figure 8F:
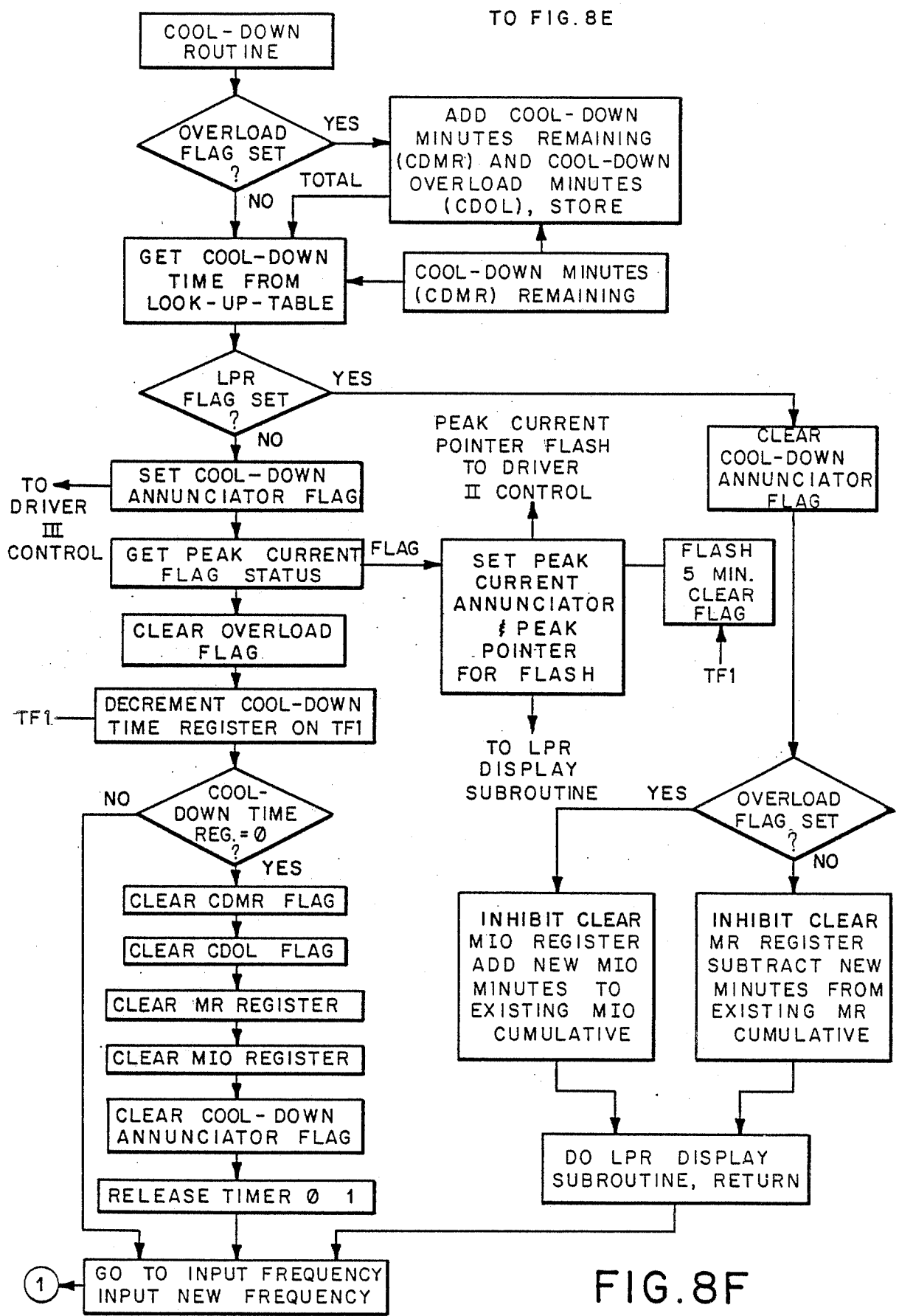
Figure 8G:
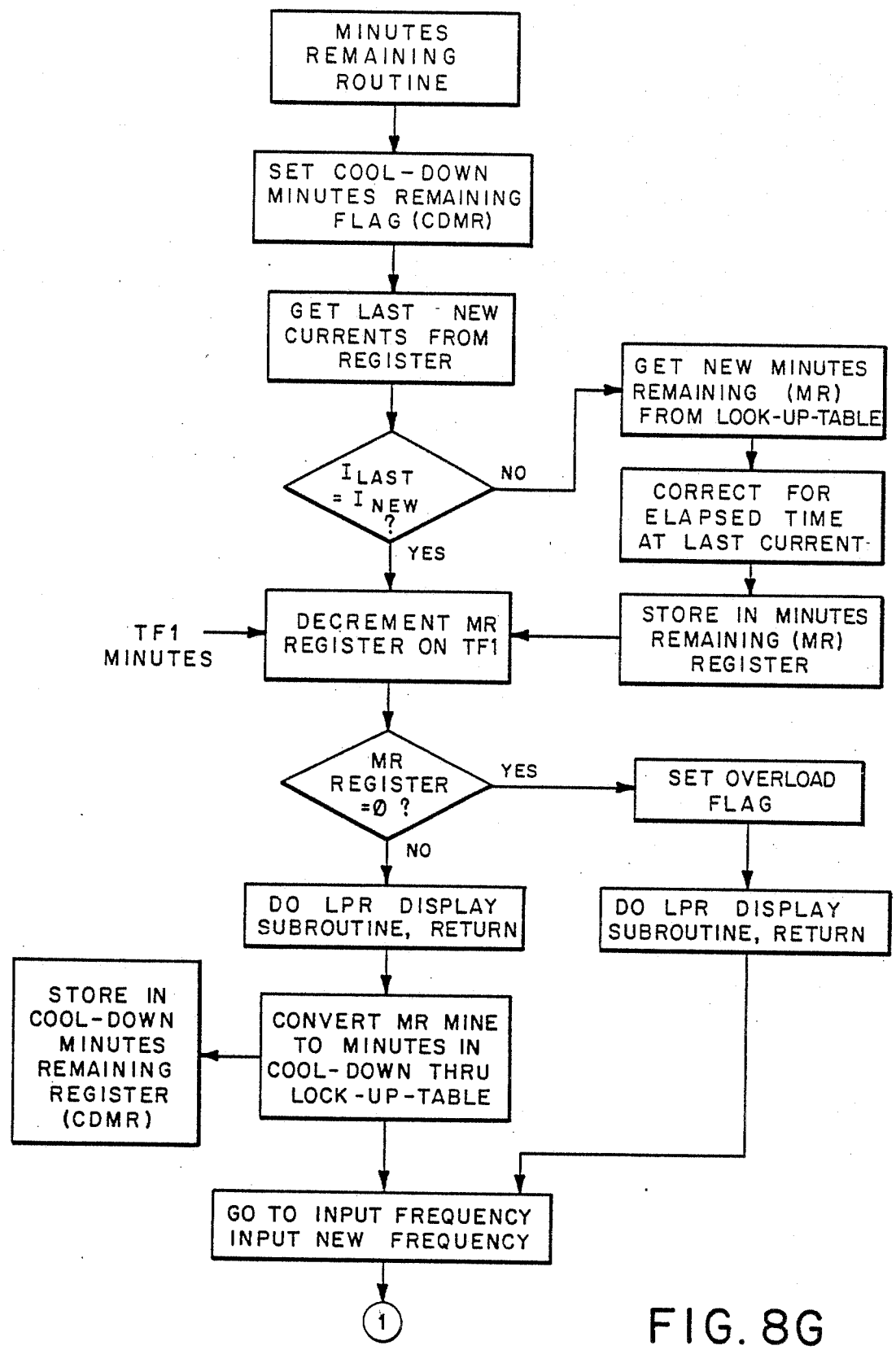
Figure 8H:
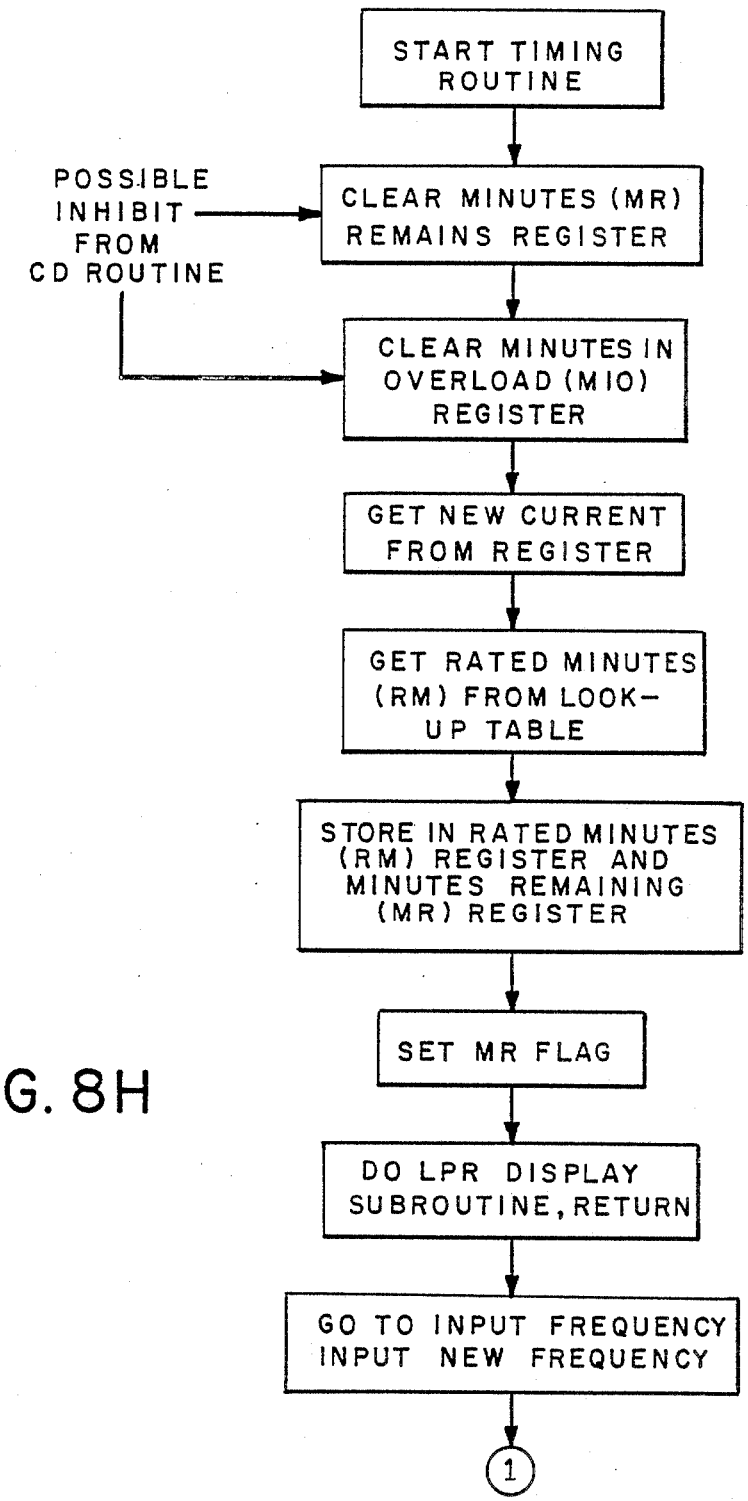

Referring to FIG. 8e, in the limited power ratings display subroutine the rated minutes and minutes remaining are taken from their respective registers (blocks 302, 310). Next the back plane for minutes remaining component 38 is set and converted, along with minutes remaining and rated minutes, to serial format and placed in the appropriate serial word register (block 322). After the LCD driver DR4 is selected and loaded, the display 22 is selectively energized to indicate rated minutes in two digit display component 36 and minutes remaining in back lighted two digit display component 38. The program next returns to block 466 of the start timing routine (FIG. 8h) where the microprocessor is commanded to input the new frequency from the current-to-frequency converter 24, block 110 of the main routine of FIG. 8a.

The microprocessor M is stepped through the main routine of FIG. 8a, similar to previously discussed except the new current (also above $I_{LPR}$) is also stored in the current register (block 118), and diverted at block 152 to the limited power ratings timer routine of FIG. 8c. It continues through that routine until decision block 232. As the minutes remaining flag has been set (block 462), the program advances to the minutes remaining routine. Turning to the minutes remaining routine of FIG. 8g, the cool down minutes remaining flag is set (block 402) and the last and new currents are retrieved from the current register. These currents are compared in decision block 406 and, if the currents are equal, the minutes remaining register is decremental on the periodic (every minute) TFI signals (see block 214). If the minutes remaining register is not yet to zero, decision block 418 directs that the microprocessor update the limited power ratings display by running through the subroutine of FIG. 8e and then return. Next the minutes remaining time is converted to minutes needed to cool down through another "look-up" table embodied in the EPROM. This is stored in the cool down minutes remaining register.

Backing up to decision block 406, assume the new current is not equal to the last current. The new minutes remaining is obtained from the "look-up" table embodied in the EPROM. It is noted that if the new above-rated current is less than the old above-rated current, the new minutes are greater. On the other hand, if the new current is above the last current, the minutes are reduced. A reduction is made for the elapsed time at the last current (block 410) and the corrected time is stored in the minutes remaining register. Now assume the minutes remaining register reaches zero. Decision block 416 directs that the overload flag be set (block 422). After the limited power ratings display subroutine is completed, the program returns to block 110 of the main routine of FIG. 8a where the new frequency of the current-to-frequency converter 24 is registered.

Assuming that this new frequency indicates that the current continues to be above the rated power current, the program steps through the main routine and limited power ratings timer routine, similar to previously described, until decision block 220 of FIG. 8c. Since the overload flag has been set (block 422), the microprocessor is directed to the minutes in overload routine of FIG. 8d. There the peak current and cool down overload flags are set, blocks 252 and 254, respectively. Next the new current is retrieved from the current register and compared with peak current in decision block 260. It is noted that the first time through this routine, the peak current register is not loaded so decision block 260 will cause it to be loaded through operation blocks 262 and 258. On the next pass, if the new current exceeds the contents of the peak current register, block 258 will send the new peak current to the pointer/digits display subroutine of FIG. 8b where the flashing peak current location is determined (block 186) and the peak current pointer, shown in phantom in FIGS. 1–3, is caused to be displayed (block 196).

The next step in the routine of FIG. 8d is decision block 266 where it is determined if the contents of the minutes in overload register equals 99. If not, the contents of the register is incremented on the periodic TFI signal (block 270). The microprocessor is then directed by operation block 272 to the limited power ratings display subroutine of FIG. 8e. As the overload flag has been set (block 422), decision block 304 requires the minutes in overload be retrieved from the minutes in overload register and that the back plane for minutes in overload digital display component 40 be set on and that the back plane for minutes remaining display component 38 be reset. After the peak current flag (set in block 252) and minutes in overload and back plane for display thereof have been serialized (block 316) and entered in the appropriate serial word register, LCD driver DR4 is selected and loaded. Next, in operation block 328, the back lighted two digit display component 40 is caused to display the minutes in overload; and the overload and peak current annunciator indicator boxes (32a and 32b, respectively) are caused to be energized. Upon return to block 272 of the minutes in overload routine of FIG. 8d, minutes times current (based upon the contents of the minutes in overload register and the TF1 inputs) is computed and stored in the cool down overload register (block 276). Finally, the microprocessor is returned to block 110 of the main routine of FIG. 8a where the new frequency of the current-to-frequency converter 24 is placed in the frequency register (block 112).

Now assume that the new power current is below the rated continuous power current ($I_{LPR}$). The limited power ratings mode flag is reset (block 142) and, since the cool down flags are set (blocks 254, 402), decision block 146 directs the microprocessor to execute the cool down routine of FIG. 8f. Since the overload flag is set (block 422), decision block 342 directs the contents of the cool down minutes remaining register (block 426) be added to the contents of the cool down overload register (block 276). Based upon this total, the cool down time is obtained from the "look-up" table in the EPROM (block 346). As the limited power ratings flag has been reset (block 142), decision block 350 causes the cool down annunciator flag to be set (block 352) so that the next time the pointer/digits display subroutine of FIG. 8b is run, the cool down annunciator indicator box 32d will be energized (see blocks 170, 178 and 182). Because the peak current flag was set (block 252) the peak current pointer and peak current annunciator indicator box 32b are caused to flash for five minutes (block 360) at the expiration of which the peak current flag is reset (block 362). Next the overload flag is cleared and the cool down time register is decremental on Afl inputs (block 358). According to decision block 364 (and assuming each new current remains below the rated power current) a loop is repeated including the main routine and the cool down routine until the cool down time register is decremented to zero. When this occurs the cool down minutes remaining, cool down overload and cool down annunciator flags are all reset. Additionally, the minutes remaining and minutes in overload registers are cleared and the microprocessor timers are released (see block 366–376) to place the logic system in a "just-energized" condition.

Suppose, however, that the current to the traction motors was raised above the continuous rated current prior to the completion of the cool down cycle. The limited power ratings flag would be set (block 152) and during running of the limited power ratings timer routine, FIG. 8c, decision block 226 would direct return to the cool down routine of FIG. 8f. There the decision block 350, because the PR flag is set, directs clearing of the cool down annunciator flag (block 378). Since the overload flag was reset (block 356), decision block 380 causes an inhibit to clearing of the minutes in the minutes remaining register (see block 452 of the start timing routine of FIG. 8h). Thus, return of the power current above the rated limited power current effects interruption of the cool down cycle and prevents its resumption until the current to the traction motors drops below the rated current level.

Operation of the electronic logic means when the traction motors are in their braking mode is analogous to that just described regarding the power mode. Reference is made in particular to decision blocks 120 and 132 of the main routine of FIG. 8a for commencing operation of the electronic logic means for the braking mode.

In view of the above, it will be seen that the several objects of the invention are achieved and other advantageous results attained.

As various changes could be made without departing from the scope of the invention, it is intended that all matter contained in the above description shall be interpreted as illustrative and not in a limiting sense.

I claim:

1. In a loadmeter for displaying information concerning the amount of current energizing electric traction motors in a locomotive, said motors having power and braking modes and having a continuous current rating, said loadmeter comprising:

means measuring the amount of traction motor current a current-to -frequency converter for providing an output signal having a frequency corresponding to the amount of current drawn by aid motors;

electronic logic means for receiving the output signal and responsive thereto, said means providing outputs indicating whether the locomotive is in the power or braking mode, the amount of current drawn, whether such amount is above the continuous rated current for the motors, said electronic logic means also providing the period of time the above-rated power or braking condition has existed; and display means connected to said logic means said display means to be mounted in the cab of said locomotive for displaying to the engineer the aforementioned outputs of said logic means.

2. A meter system as set forth in claim 1 wherein said logic means includes means for providing an output indicating the allowable time the above-rated condition can exist before an overload condition exists.

3. A meter system as set forth in claim 2 wherein said logic means includes means for providing an output indicating an overload condition exists.

4. A meter system as set forth in claim 3 wherein said display means comprises annunciator means providing unique color indication when said motors are in the power mode, the braking mode, and an above-rated current condition exists 5. A meter system as set forth in claim 1 wherein said converter includes adjustment means so that a predetermined maximum braking current causes a predetermined low frequency output, with lesser braking currents and increasing power currents producing increasingly greater frequency outputs of said converter.

6. A meter system as set forth in claim 1 wherein said current-to-frequency converter comprises a current-to-voltage converter and a voltage-to-frequency converter.

7. A meter system as set forth in claim 1 wherein said converter and said electronic logic means are electrically isolated and said system comprises an optical coupler for coupling said converter and said logic means.

8. A traction load meter system for displaying information concerning the amount of current energizing electric drive motors in a locomotive, said motors having power and braking modes and having a continuous current rating above which said motors can operate for only a limited time before an overload condition exists, said system comprising;
   an electric drive motor in a locomotive;
   means measuring the amount of current energizing said motor;
   a current-to-frequency converter for providing an output signal having a frequency corresponding to the amount of current drawn by said motors;
   electronic logic means for receiving the output signal and responsive thereto to provide outputs indicating whether the locomotive is in the power or braking mode, the amount of current drawn, and whether an overload condition exists; and
   display means connected to said logic means and adapted to be mounted in the cab of said locomotive for displaying to the engineer the aforementioned outputs of said logic means.

9. In a traction loadmeter system for displaying information concerning the amount of current energizing electric motors which drive a locomotive, said motors having power and braking modes and having a continuous current rating above which said motors can operate for only a limited time before an overload condition exists, the improvement comprising;
   a current-to-frequency converter for providing an output signal having a frequency corresponding to the amount of current drawn by said motors;
   electronic logic means for receiving the output signal and responsive thereto to provide outputs indicating whether the locomotive is into the power or braking mode, the amount of current drawn, whether such amount is above the continuous rated current for the motors, and whether an overload condition exists; and
   display means connected to said logic means and adapted to be mounted in the cab of said locomotive for displaying to the engineer the amount of current drawn and providing a unique indication when the motors are in the power mode, the braking mode, the current drawn is above rated current, and an overload condition exists.

10. A meter system as set forth in claim 9, wherein said indication is visual.

11. A meter system as set forth in claim 10 wherein said display means comprises means for providing unique color visual indication for the braking mode, the power mode, and when the motors draw current above rated current.

* * * * *